(12) United States Patent
Constantin

(10) Patent No.: US 7,719,354 B2
(45) Date of Patent: May 18, 2010

(54) DYNAMIC BIASING SYSTEM FOR AN AMPLIFIER

(75) Inventor: Nicolas Constantin, Lasalle (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/165,877

(22) Filed: Jul. 1, 2008

(65) Prior Publication Data

US 2009/0002068 A1    Jan. 1, 2009

Related U.S. Application Data

(63) Continuation of application No. 11/102,472, filed on Apr. 8, 2005, now Pat. No. 7,405,617.

(60) Provisional application No. 60/561,236, filed on Apr. 9, 2004.

(51) Int. Cl.
H03G 5/16 (2006.01)
(52) U.S. Cl. ...................................... 330/134; 330/285
(58) Field of Classification Search ................. 330/134, 330/136, 296, 129, 285
See application file for complete search history.

(56) References Cited

U.S. PATENT DOCUMENTS 6,683,496 B2 * 1/2004 Poggi et al. ................. 330/132
6,794,935 B2 * 9/2004 Klomsdorf et al. .......... 330/129
7,046,087 B1 * 5/2006 Naik et al. .................. 330/136

* cited by examiner

Primary Examiner—Henry K Choe

(57) ABSTRACT

A dynamic biasing system ("DBS") for dynamically biasing an amplifier with an adjusted bias signal is shown. The DBS may include a first biasing circuit that produces a bias signal and a second biasing circuit in signal communication with both the first biasing circuit and the amplifier, wherein the second biasing circuit compares the bias signal to a predetermined threshold and in response produces the adjusted bias signal.

14 Claims, 11 Drawing Sheets

DYNAMIC BIASING SYSTEM FOR AN AMPLIFIER

REFERENCE TO EARLIER-FILED APPLICATIONS

This application is a continuation of U.S. patent application Ser. No. 11/102,472, filed on Apr. 8, 2005 now U.S. Pat. No. 7,405,617 entitled "Dynamic Biasing System For An Amplifier," the entire disclosure of which is incorporated herein by reference; which claims priority to U.S. Provisional Application No. 60/561,236, filed on Apr. 9, 2004, entitled "Dynamic Biasing System For An Amplifier," the entire disclosure of which is incorporated herein by reference.

BACKGROUND OF THE INVENTION

1. Field of the Invention

This invention generally relates to power amplifiers, and in particular, to dynamic biasing of power amplifiers.

2. Related Art

In today's society, both the presence and use of communication systems are increasing at a rapid pace and wireless and broadband communication systems and infrastructures continue to grow. This acceleration has created a strong and ever-growing market for electronic equipment that employs more powerful, efficient, and inexpensive communication components.

Electronic equipment such as computers, wireless devices, broadband devices (i.e., standard telephones), radios, televisions and other similar devices may communicate with one another by passing transmission signals through free-space (i.e., air and space) and through guided media such as wire, cable, microwave, millimeter wave, sonic, and optical connections. These transmission signals go through various processing steps during their communication. One such processing step involves amplifying the transmission signals.

FIG. 1 is an example amplifier transfer function plot 100 of output voltage 102 versus input voltage 104 with an amplification curve 106 that graphically illustrates the typical linear amplification process. In FIG. 1, an input signal 108, having input amplitude 110, is linearly amplified to an output signal 112 having amplified output amplitude 114. If the amplifier gain is one ("0 decibels" also known as "0 dB"), the output amplitude 114 will be of the same magnitude as the input amplitude 110. If the amplifier gain is greater than one (a positive value in dB), the output amplitude 114 will be greater than the input amplitude 110. If the amplifier gain is smaller than 1 (a negative value in dB), the output amplitude 114 will be less than the input amplitude 110. If the amplifier operates in a mode that provides good linearity, then an increase in the amplitude of signal 110 in a given proportion will result in an increase of signal 114 in the exact same proportion. This mode of operation, however, generally requires a higher level of current supply, and thus tends to make the amplifier less energy efficient. For the amplifier to operate in a mode that yields good efficiency, it is required generally that the current consumption be lower. This, however, generally causes the amplifier to reach output signal compression earlier, meaning that for high levels of the output signal, the amplitude of signal 114 cannot increase in the same proportion as signal 110, but instead will have a smaller amplitude increase.

Thus, in amplifying these transmission signals, the power amplifiers within the electronic equipment (such as the type utilized in current commercial applications such as wireless handsets and the like) typically suffer a tradeoff between efficiency and linearity. According to this tradeoff, improvements in linearity are typically achieved by sacrificing the efficiency of the power amplifier through increased biasing.

As an example, FIG. 2 shows an example conventional amplifier 202 within an electronic device 200. The amplifier 202 is typically utilized to increase the power of an input transmission signal 204 from its original power level at an input 206 of the amplifier 202 to the desired power level of an output signal 208 at an output 210 of the amplifier 202. For an input transmission signal 204 having a low power level, the amplifier 202 generally receives sufficient bias current from a power supply 212 and from the biasing circuit 216 of the electronic device 200 to operate. It is appreciated by those skilled in the art that as the power level of the input transmission signal 204 increases, the amplifier 202 may require additional bias current from the power supply 212 and the biasing circuit 216 to operate properly. However, at higher power levels, the circuitry (not shown) that delivers the bias current from the power supply 212 and the biasing circuit 216 to the amplifier 202 may not be able to supply the higher bias current to the amplifier 202, due to hardware limitations in the circuitry.

A known approach to reduce the effects of this problem is to utilize a biasing circuit 216 that provides the amplifier 202 with a higher nominal bias current intensity via signal path 218. However, this approach tends to increase the current consumption of the amplifier, and thus degrade its energy efficiency at lower power levels.

Although this additional bias current enables the amplifier 202 to extend its linear amplification operation as power increases, the amplifier 202 may still experience compression at the highest power levels. When the amplifier 202 experiences compression, its actual output is less than a desired output. For example, if the amplifier 202 is designed to give a gain of 5 decibels ("dB") to a transmission signal 204 but only gives 4.5 dB, the amplifier 202 may be characterized as experiencing a compression of 0.5 dB. It is appreciated by those skilled in the art that extreme input transmission signal 204 power levels may actually cause the amplifier 202 to severely distort the signal and totally compromise the integrity of the information contained in that signal, beyond any possibility of recovering the data at a receiver.

When the power level of the input transmission signal 204 reaches a threshold value (typically known as the amplifier "gain compression point"), the compression of the amplifier 202 reaches a point at which it is more efficient, but less linear. Therefore, there is a need to extend the amplifier gain compression point to a higher output power level and improve the tradeoff between efficiency and linearity in a power amplifier.

FIG. 3 shows an example implementation of an electronic device 300 utilizing a known approach for extending the amplifier gain compression point to a higher output power level and improving the tradeoff between efficiency and linearity in an amplifier 302 utilizing a technique generally known as dynamic biasing. In dynamic biasing, the level of biasing is determined responsive to the amplitude of a radio frequency ("RF") signal 304 at the input 306 of the amplifier 302. As the amplitude changes, so does the level of biasing. A typical approach to dynamic biasing involves detecting the envelope of the RF signal 304 (through a diode-based circuit for example) and biasing the amplifier 302 as a function of the RF signal 304 envelope. This way, the biasing level is kept to a minimum at low power levels, and is allowed to automatically adjust at a higher level as the RF signal power increases, thus optimizing the energy efficiency at low power levels and improving the efficiency/linearity trade-off at higher power levels.

An external detection circuit 308 (i.e., a circuit external to a biasing circuit 310) is utilized to detect the envelope of the RF signal 304, via signal path 312, and provide the necessary information for linearity correction and efficiency control to the biasing circuit 310. Additionally, the external detection circuit 308 may also optionally detect the envelope of the RF output signal 314, via signal path 316. The biasing circuit 310 then provides the necessary biasing current, via signal path 318, to the amplifier 302.

However, a problem with this approach is that it may consume an excessive amount of semiconductor chip space. This problem in this approach is that the external detection circuit 308 is external to the biasing circuit 310, and may need temperature compensation circuitry (not shown) and pre-biasing circuitry (not shown). The temperature compensation circuitry compensates for temperature variations, and the pre-biasing circuitry is often required to place the external detection circuitry 308 in the necessary state of sensitivity. Additional problems with this approach also include excessive cost and complexity.

As a result, there is also a need to extend the amplifier gain compression point to a higher output power level and improve the tradeoff between efficiency and linearity in an amplifier utilizing a dynamic biasing system that is not external to the biasing circuit.

SUMMARY

Disclosed is a dynamic biasing system ("DBS") for dynamically biasing an amplifier with an adjusted bias signal. The DBS may include a first biasing circuit that produces a bias signal and a second biasing circuit in signal communication with both the first biasing circuit and the amplifier, wherein the second biasing circuit compares the bias signal to a predetermined threshold and in response produces the adjusted bias signal. The second biasing circuit may produce a boosting signal in response to comparing the bias signal to the predetermined threshold and the DBS may also include a combiner in signal communication with the first biasing circuit, second biasing circuit and the power amplifier, wherein the combiner produces the adjusted bias signal by combining the bias signal with the boosting signal.

Disclosed is also a multi-stage DBS for dynamically biasing a multi-stage amplifier, having a driver stage and a power stage. The multi-stage DBS may include a first DBS and second DBS. The first DBS may include a first DBS first biasing circuit that produces a first bias signal and a first DBS second biasing circuit in signal communication with the first DBS first biasing circuit, wherein the first DBS second biasing circuit compares the first bias signal to a predetermined threshold, the value of which threshold is dependent on the application in which the DBS is used, and which also may be adjusted by the user, and in response produces a first adjusted bias signal that is passed to the driver stage. The second DBS may include a second DBS first biasing circuit that produces a second bias signal, a second DBS second biasing circuit in signal communication with the first DBS first biasing circuit, and a second DBS combiner in signal communication with both the second DBS first biasing circuit and second DBS second biasing circuit. Wherein the second DBS second biasing circuit compares the first bias signal to a predetermined threshold and in response produces a second DBS boosting signal that is passed to the second DBS combiner and wherein the second DBS combiner produces a second adjusted bias signal by combining the second bias signal with the second DBS boosting signal that is passed to the power stage.

Similarly disclosed is another multi-stage DBS for dynamically biasing a multi-stage amplifier, having a driver stage and a power stage. The multi-stage DBS may include a first DBS and a second DBS. The first DBS may include a first DBS first biasing circuit that produces a first bias signal, a first DBS second biasing circuit, a first DBS combiner in signal communication with the first DBS first biasing circuit and first DBS second biasing circuit, wherein the first DBS combiner produces a first adjusted bias signal that is passed to the driver stage. The second DBS may include a second DBS first biasing circuit that is in signal communication with the first DBS second biasing circuit, wherein the second DBS first biasing circuit produces a second bias signal, a second DBS second biasing circuit in signal communication with the second DBS first biasing circuit, and a second DBS combiner in signal communication with both the second DBS first biasing circuit and second DBS second biasing circuit. Wherein the first DBS second biasing circuit compares the second bias signal to a predetermined threshold and in response produces a first DBS boosting signal that is passed to the first DBS combiner, wherein the first DBS combiner produces the first adjusted bias signal by combining the second bias signal with the first DBS boosting signal and wherein the second DBS second biasing circuit compares the second bias signal to the predetermined threshold and in response produces a second DBS boosting signal that is passed to the second DBS combiner, wherein the second DBS combiner produces a second adjusted bias signal by combining the second bias signal with the second DBS boosting signal that is passed to the power stage.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
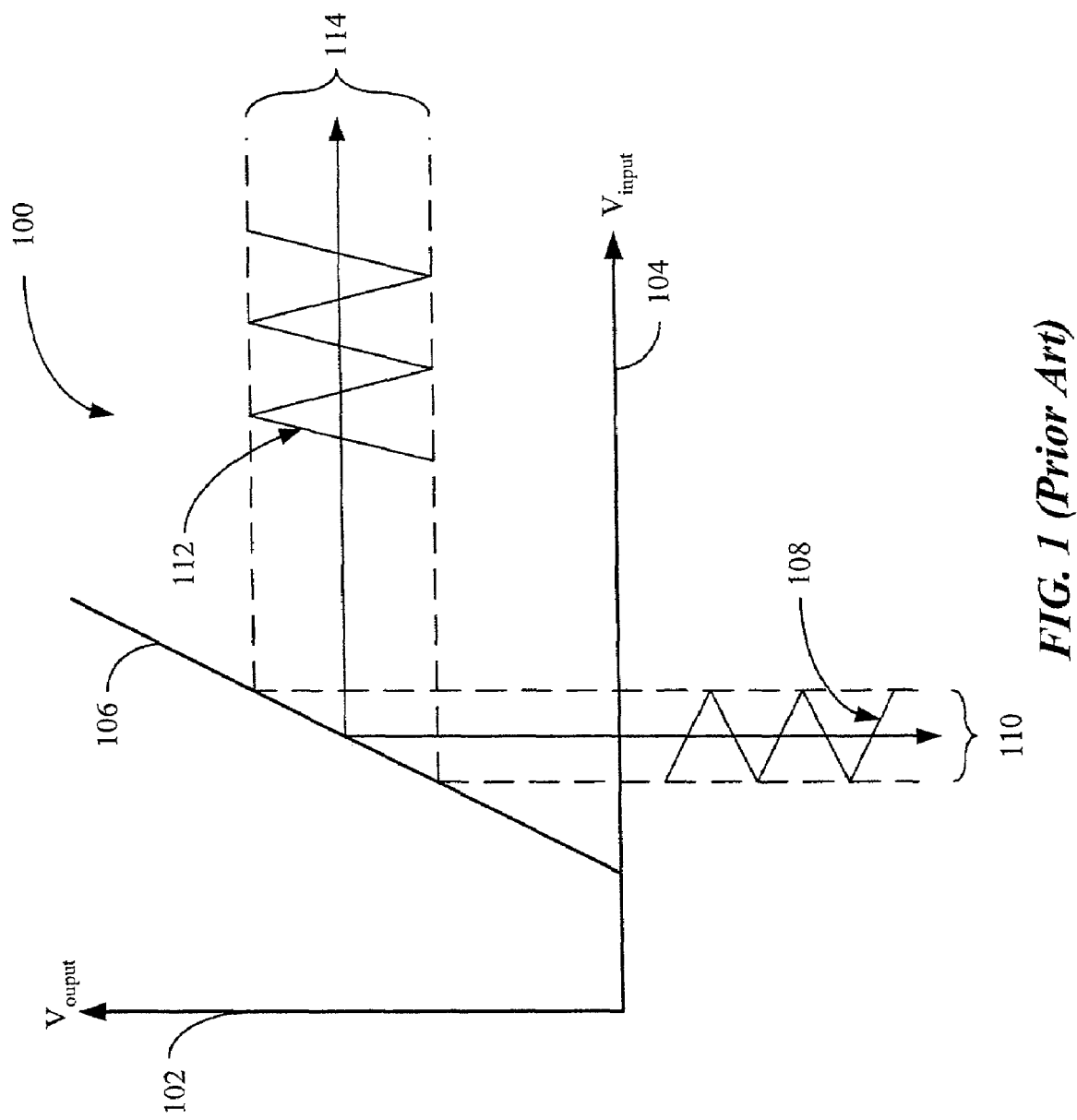
FIG. 1 is an example amplifier transfer function plot of output voltage versus input voltage with an amplification curve that graphically illustrates a typical linear amplification process.
Figure 2:
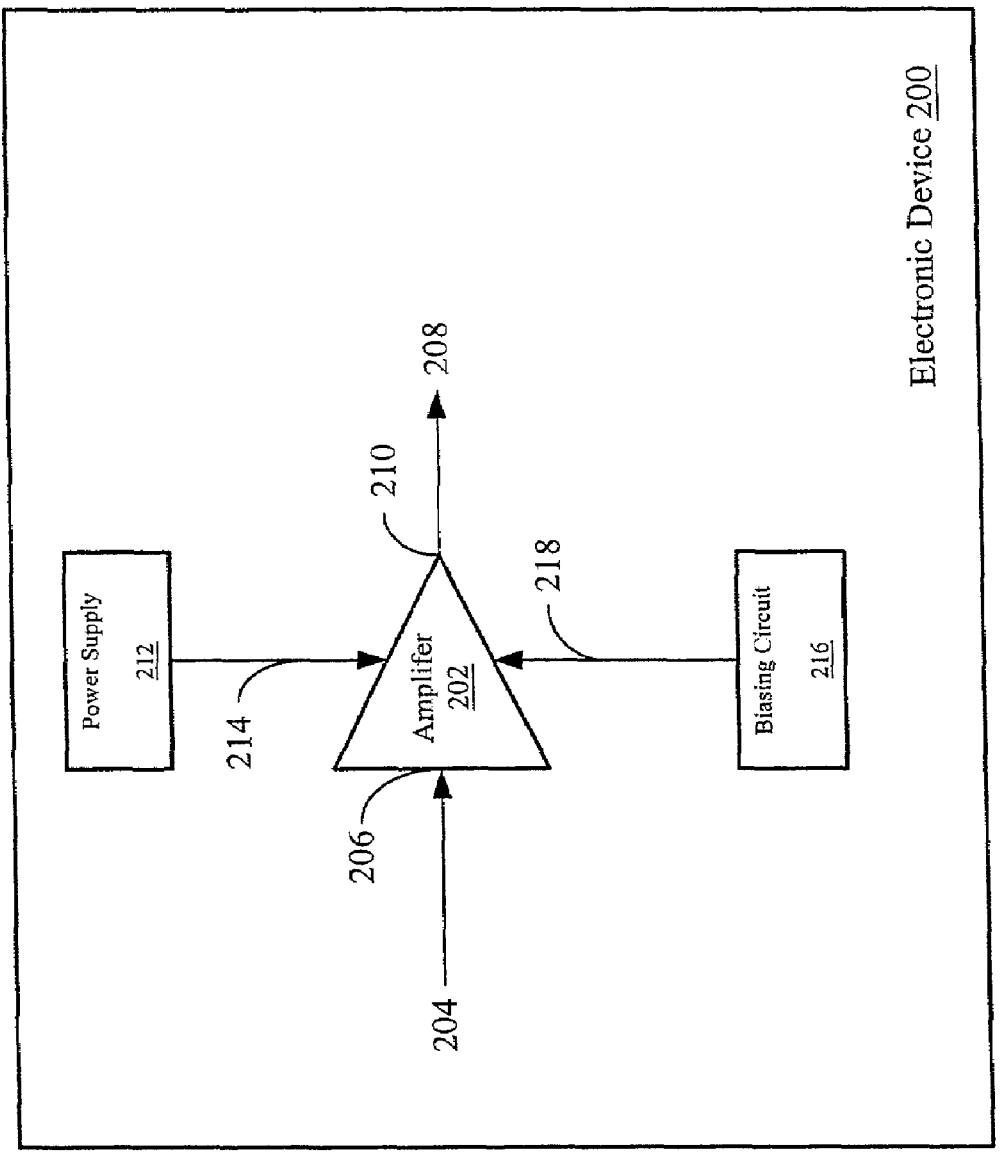
FIG. 2 is a block diagram of an example of a known implementation of a conventional amplifier within an electronic device.
Figure 3:
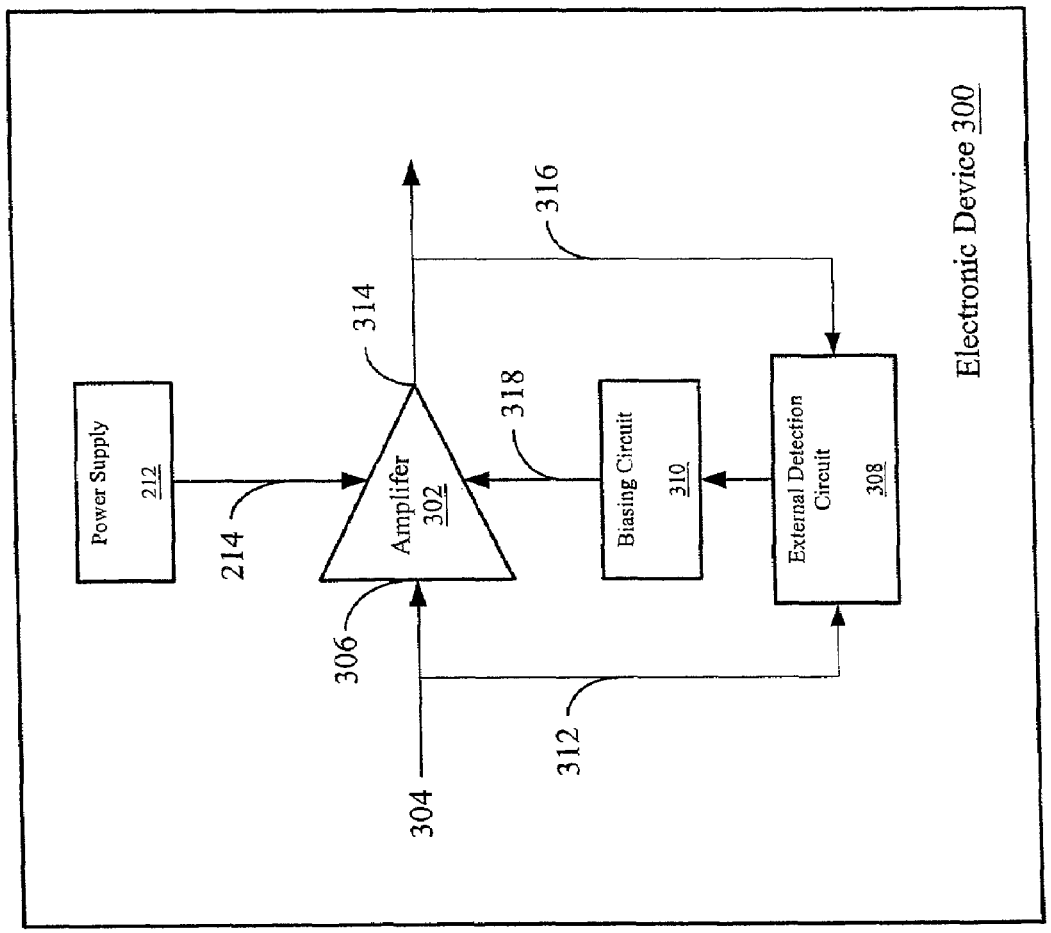
FIG. 3 is a block diagram of an example of a known implementation of an electronic device utilizing dynamic biasing.
Figure 4:
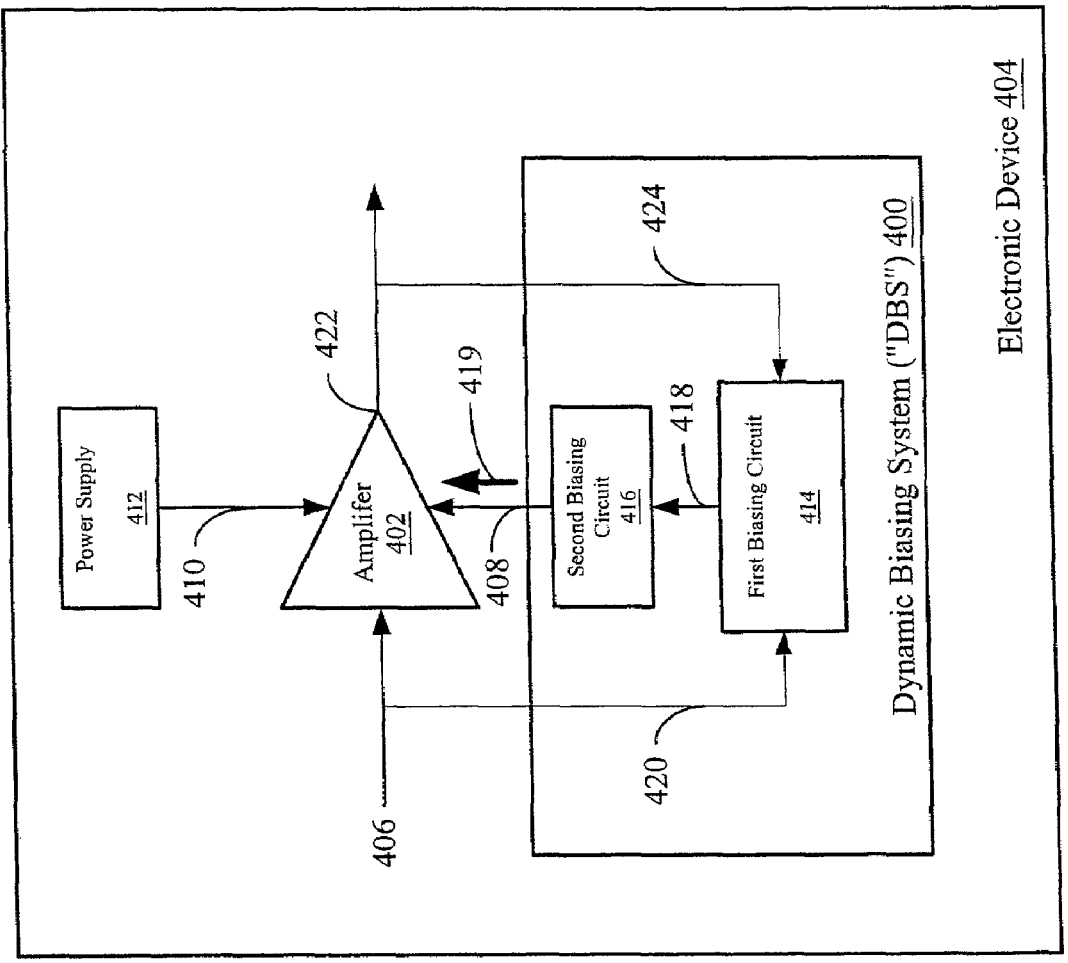
FIG. 4 is a block diagram of an example of an implementation of dynamic biasing system ("DBS") in signal communication with an amplifier within an electronic device.

In FIG. 4, a block diagram of an example of an implementation of dynamic biasing system ("DBS") 400 in signal communication with an amplifier 402 (such as for example a power amplifier) within an electronic device 404 is shown. In this example, the power amplifier 402 may have an RF input 406, control input 408, and power supply input 410 from a power supply 412. The DBS 400 provides a bias signal to the control input 408 of the power amplifier 402. The DBS 400 may include a first biasing circuit 414 and a second biasing circuit 416. The first biasing circuit 414 produces a bias signal 418. The second biasing circuit 416 monitors the bias signal 418 and compares it to a predetermined threshold. If the bias signal 418 is below the predetermined threshold, the second biasing circuit 416 then passes the bias signal 418 to the control input 408 of the power amplifier 402. If instead, the bias signal 418 equals or exceeds the predetermined threshold, the second biasing circuit 416 adjusts the bias signal 418 and provides an adjusted bias signal 419 to the control input 408 of the power amplifier 402.

Generally, when the bias signal 418 is below the predetermined threshold, the sourcing capability of the bias signal 418 is limited, which may cause the power amplifier 402 to go into compression. Therefore, in order to compensate for the potentially limited sourcing capability of the bias signal 418, the second biasing circuit 416 acts as a switching and feedback mechanism that provides additional sourcing capability to the power amplifier 402 via the adjusted bias signal 419. This compensation procedure, which includes providing additional sourcing capability to the power amplifier 400, is equivalent to boosting the bias signal 418.

The bias signal 418 may exhibit a high degree of correlation with the envelope of the signal provided to the RF input 406 of the power amplifier 402. That is to say, the bias signal 418 may increase when the envelope of the RF input 406 increases, and decrease when the envelope decreases. The second biasing circuit 416 may boost the bias signal 418 when the bias signal 418 equals or exceeds a predetermined threshold. Therefore, when the envelope of the RF input 406 to the power amplifier 402 reaches a certain level, the control input 408 of the power amplifier 402 may be boosted.

The example biasing scheme may include an internal detection circuit (not shown) in the DBS 400 for detecting the envelope of the incoming RF signal 406 via signal path 420, based on the intensity of the bias signal 418. It is appreciated by those skilled in the art that by utilizing the bias signal 418 as a "proxy" for the envelope of the RF input 406, the first biasing circuit 414 may include detection circuitry configured to detect the RF envelope. Because the detection circuitry may also include temperature compensation and pre-biasing features, no additional circuitry is required for temperature compensation or pre-biasing, unlike the case where an external detection scheme is utilized. Similarly, the example biasing scheme may include an internal detection circuit (not shown) in the DBS 400 for detecting the envelope of the RF output signal 422 from the power amplifier 402 via signal path 424, based on the intensity of the bias signal 418. Again, it is appreciated by those skilled in the art that by utilizing the bias signal 418 as a "proxy" for the envelope of the RF output 422, the first biasing circuit 414 may include detection circuitry configured to detect the RF envelope of the RF output signal 422.

Figure 5:
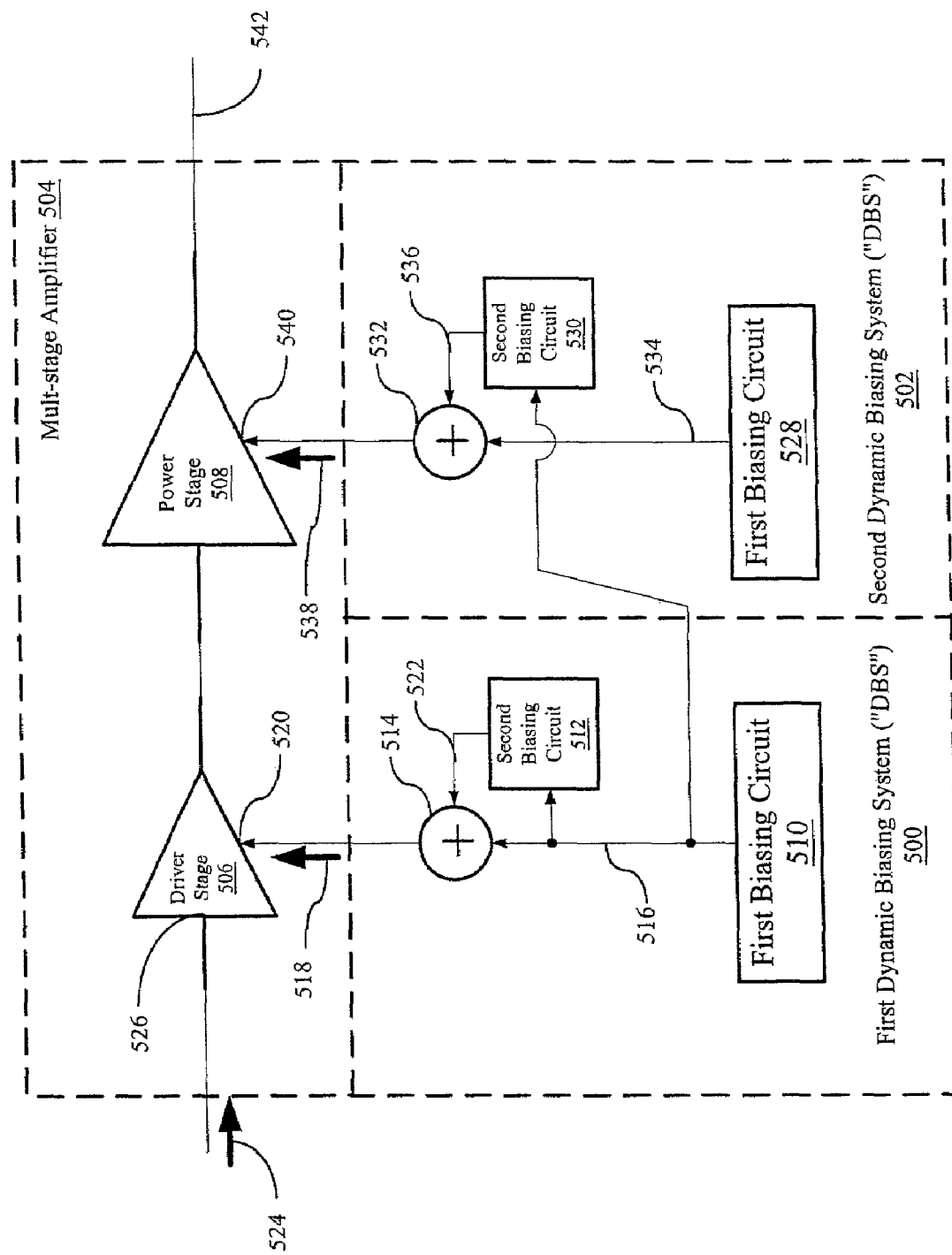
FIG. 5 is a block diagram of an example of an implementation of a plurality of DBSs in signal communication within a multi-stage amplifier.

In FIG. 5, a block diagram of an example of an implementation of a plurality of DBSs 500 and 502 in signal communication within a multi-stage amplifier 504 is shown. The plurality of DBSs 500 and 503 may be generally known as a multi-stage DBS. The multi-stage amplifier 504 may include a driver stage 506 and a power stage 508. The first DBS 500 may dynamically bias the driver stage 506 and the second DBS 502 may dynamically bias the power stage 508.

As an example, the first DBS 500 may include a first biasing circuit 510, second biasing circuit 512, and combiner 514. The first biasing circuit 510 may be in signal communication with the second biasing circuit 512 and the combiner 514. Additionally, the second biasing circuit 512 may also be in signal communication with the combiner 514. The combiner 514 may be implemented utilizing summation circuit known generally as a summer. Additionally, the combiner 514 may be optionally a component of the second biasing circuit 512 or an external circuit.

In operation, the first biasing circuit 510 may provide a bias signal 516 to both the second biasing circuit 512 and combiner 514. In response, the combiner 514 produces an adjusted bias signal 518 and passes it to the control input 520 of the driver stage 506. The second biasing circuit 512 monitors the bias signal 516 and compares it to a predetermined threshold.

If the bias signal 516 equals or exceeds the predetermined threshold, the second biasing circuit 512 adjusts the bias signal 516 by producing a boosting signal 522 and passes it to the combiner 514. The combiner 514 then combines the bias signal 516 with the boosting signal 522 and produces the adjusted biasing signal 518. If, instead, the bias signal 516 is below the predetermined threshold, the second biasing circuit 512 does not produce the boosting signal 522 and therefore the combiner 514 passes the bias signal 516 as the adjusted bias signal 518. As an example of implementation, the second biasing circuit 512 may be deactivated when the bias signal 516 is below the predetermined threshold such that no boosting signal 522 is provided to the combiner 514. The bias signal 516 may exhibit a high degree of correlation with the envelope of the RF input signal 524 provided to the RF input 526 of the driver stage 506. The second biasing circuit 512 may boost the bias signal 516 when the bias signal 516 equals or exceeds a predetermined threshold. Therefore, when the envelope of the RF input signal 524 to the driver stage 506 of the multi-stage amplifier 504 reaches a certain level, the control input 520 of the driver stage 506 may be boosted. Similar to FIG. 4, this biasing scheme may include an internal detection circuit (not shown) in the DBS 500 for detecting the envelope of the RF input signal 524 based on the intensity of the bias signal 516.

As an example of an implementation, it is appreciated by those skilled in the art that the adjusted bias signal 518 may be coupled to a control input of a transistor (not shown) within the driver stage amplifier 506. In this example, the control input 520 may be a base current to the base of a bipolar transistor (not shown), or a gate voltage to a field-effect transistor (not shown) or the like within the driver stage 506. In this example, the bias signal 516 may have a high degree of correlation with the envelope of the RF input signal 524.

Similarly, the second DBS 502 may include a first biasing circuit 528, second biasing circuit 530, and combiner 532. The first biasing circuit 528 may be in signal communication with the combiner 532 and the first biasing circuit 510 of the first DBS 500 may be in signal communication with the second biasing circuit 530 of the second DBS 502. Additionally, the second biasing circuit 530 may also be in signal communication with the combiner 532. The combiner 532 may be implemented utilizing summation circuit known generally as a summer. Additionally, the combiner 532 may be optionally a component of the second biasing circuit 530 or an external circuit.

In operation, the first biasing circuit 528 may provide a second bias signal 534 to the combiner 532. The second biasing circuit 530 may produce a second boosting signal 536 in response to receiving the biasing signal 516. In response, the combiner 532 produces a second adjusted bias signal 538 and passes it to a control input 540 of the power stage 508 of the multi-stage amplifier 504. Similar to the second biasing circuit 512 of the first DBS 500, the second biasing circuit 530 of the second DBS 502 monitors the bias signal 516 and compares it to a second predetermined threshold. The example biasing scheme may include an internal detection circuit (not shown) in the second DBS 502 for detecting the envelope of an RF output signal 542 from the power stage 508 of the multi-stage amplifier 504.

Figure 6:
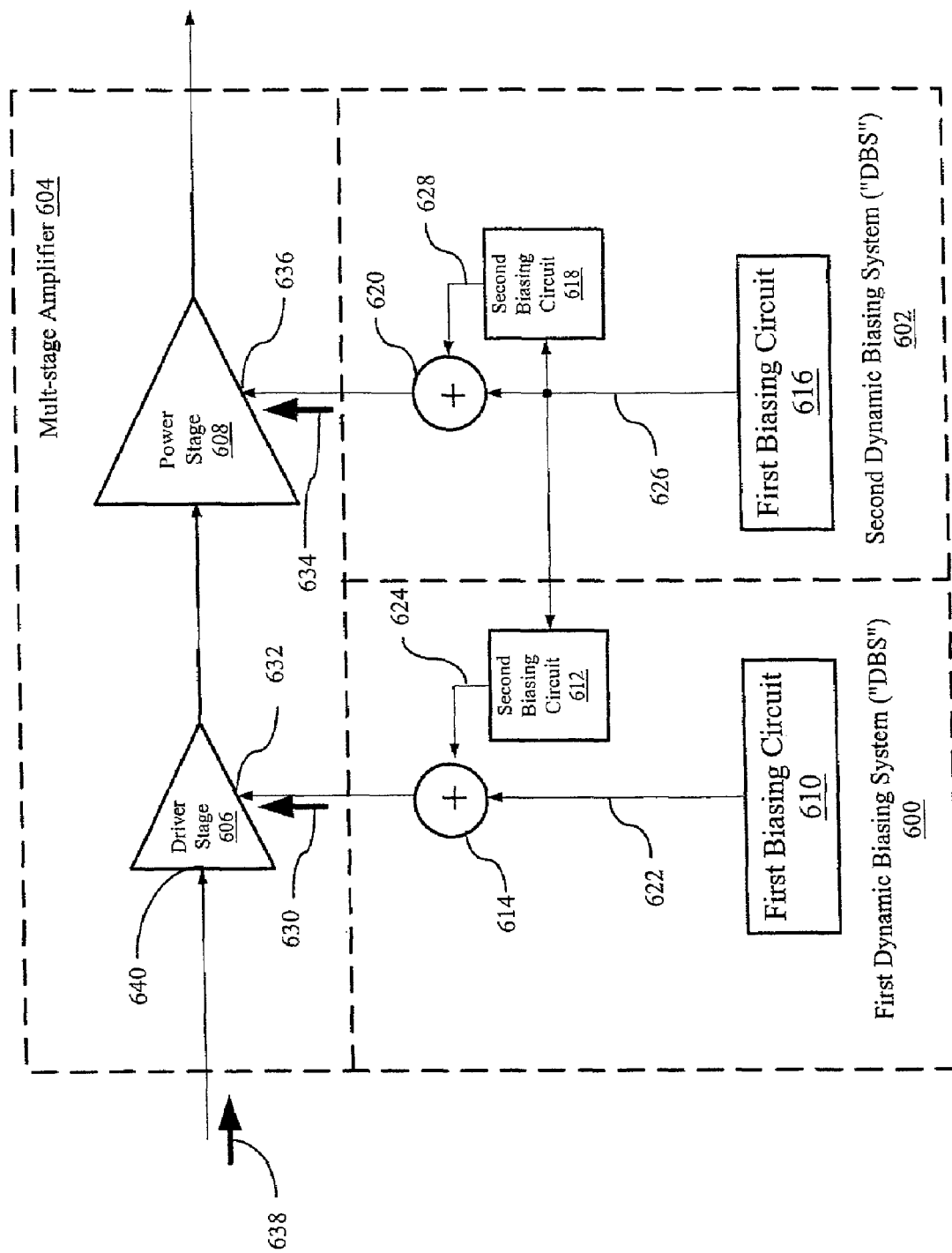
FIG. 6 is a block diagram of another example of an implementation of a plurality of DBSs in signal communication within a multi-stage amplifier.

As an example of an implementation, it is appreciated that the second adjusted bias signal 538 may be coupled to a control input of a transistor (not shown) within the power stage 508. In this example, the control input 540 may be a base current to the base of a bipolar transistor (not shown), or a gate voltage to a field-effect transistor (not shown) or the like within the power stage 508. Again, in this example, the bias signal 516 may have a high degree of correlation with the envelope of the RF input signal 524. In FIG. 6, a block diagram of an example of another implementation of a plurality of DBSs 600 and 602 in signal communication within a multi-stage amplifier 604 is shown. The plurality of DBSs 600 and 602 may be generally known as a multi-stage DBS. The multi-stage amplifier 604 may include a driver stage 606 and a power stage 608. The first DBS 600 may dynamically bias the driver stage 606 and the second DBS 602 may dynamically bias the power stage 608.

As an example, the first DBS 600 may include a first biasing circuit 610, second biasing circuit 612, and combiner 614. The second DBS 602 may include a first biasing circuit 616, second biasing circuit 618, and combiner 620. The first biasing circuit 610 may be in signal communication with the combiner 614. Additionally, the second biasing circuit 612 may also be in signal communication with the combiner 614. The combiner 614 may be implemented utilizing summation circuit known generally as a summer.

In operation, the first biasing circuit 610 of the first DBS 600 provides a bias signal 622 and the second biasing circuit 612 of the first DBS 600 provides a boosting signal 624 to the combiner 614. Similarly, the first biasing circuit 616 of the second DBS 602 provides a second bias signal 626 and the second biasing circuit 618 of the second DBS 602 provides a second boosting signal 628 to the combiner 620. Additionally, the first biasing circuit 616 of the second DBS 602 also passes the second biasing signal 626 to both second biasing circuit 612 of the first DBS 600 and the second biasing circuit 618 of the second DBS 602. In response, the combiner 614 produces a first adjusted bias signal 630 and passes it to the control input 632 of the driver stage 606, and combiner 620 produces a second adjusted bias signal 634 and passes it to the control input 636 of the driver stage 608.

Unlike the example shown in FIG. 5, in FIG. 6 both the second biasing circuit 612 of the first DBS 600 and the second biasing circuit 618 of the second DBS 602 monitor the second bias signal 626 and compare it to a predetermined threshold or thresholds.

If the second bias signal 626 equals or exceeds the predetermined threshold, both the second biasing circuit 612 of the first DBS 600 and the second biasing circuit 618 of the second DBS 602 adjust the first bias signal 622 and second bias signal 626 by producing the first boosting signal 624 and second boosting signal 628, respectively, and passing first boosting signal 624 to combiner 614 and the second boosting signal 626 to combiner 620. The combiner 614 then combines the first bias signal 622 with the first boosting signal 624 and produces the first adjusted biasing signal 630. Similarly, the combiner 620 then combines the second bias signal 626 with the second boosting signal 628 and produces the second adjusted biasing signal 634. If, instead, the second bias signal 626 is below the predetermined threshold, neither the second biasing circuit 612 of the first DBS 600 and the second biasing circuit 618 of the second DBS 602 produces the first boosting signal 624 and second boosting signal 628, respectively. Therefore, the combiner 614 passes the first bias signal 622 as the first adjusted bias signal 630 and the combiner 620 passes the second bias signal 626 as the second adjusted bias signal 634. As an example of implementation, both the second biasing circuit 612 of the first DBS 600 and second biasing circuit 618 of the second DBS 602 may be deactivated when the second bias signal 626 is below the predetermined threshold such that no boosting signals 624 and 628 are provided to the combiners 614 and 620, respectively.

The first bias signal 622 and second bias signal 626 may exhibit a high degree of correlation with the envelope of the RF input signal 638 provided to the RF input 640 of the driver stage 606. Similar to FIG. 4, this biasing scheme may include an internal detection circuit (not shown) in the first DBS 600 and second DBS 602 for detecting the envelope of the RF input signal 638 based on the intensity of the first bias signal 622 and second bias signal 626.

As an example of an implementation, it is appreciated that the first adjusted bias signal 630 may be coupled to a control input of a transistor (not shown) within the driver stage 606 and the second adjusted bias signal 634 may be coupled to a control input of a transistor (not shown) within the power stage 608. In this example, the control input 632 may be a base current to the base of a bipolar transistor (not shown), or a gate voltage to a field-effect transistor (not shown) or the like within the driver stage 606. Similarly, the control input 636 of the power stage 608 may be a base current to the base of a bipolar transistor (not shown), or a gate voltage to a field-effect transistor (not shown) or the like within the power stage 608. In this example, both the first bias signal 622 and second bias signal 626 may have a high degree of correlation with the envelope of the RF input signal 638.

Additional examples of implementations are possible, including an implementation where the multi-stage amplifier 604 is instead a single stage device including a single dynamic biasing circuit. This example of implementation provides for dynamically biasing the power amplifier responsive to a bias signal generated by a biasing circuit included as part of the dynamic biasing system. In another implementation, the multi-stage amplifier 604 may be a two-stage device, but the dynamic biasing of the driver stage may be performed responsive to a bias signal generated within the dynamic biasing system for the driver stage. In addition, the dynamic biasing of the power stage may be performed responsive to a bias signal generated within the dynamic biasing system for the power stage. Such implementation would be logical extensions of the example implementations of FIGS. 5 and 6.

Figure 7:
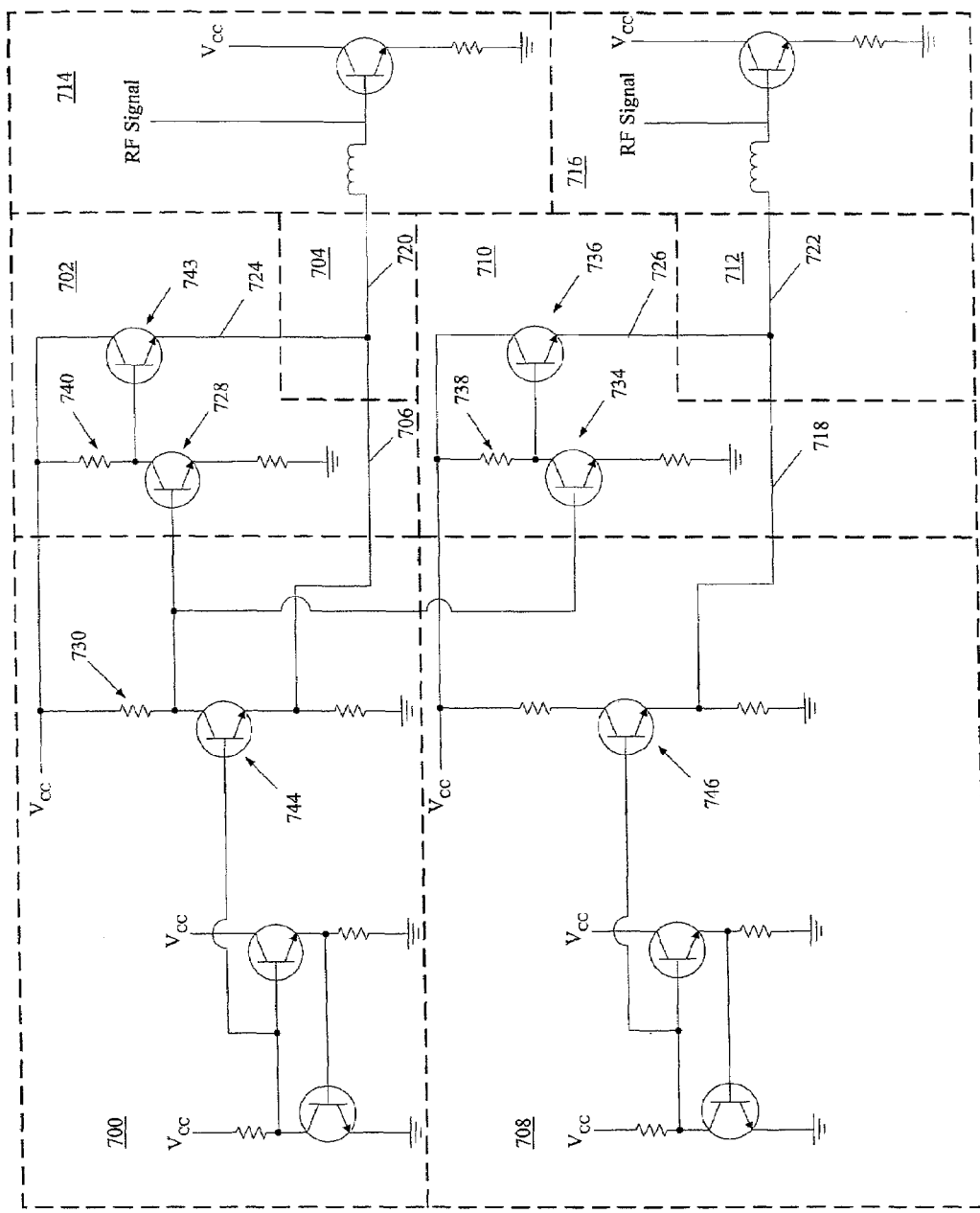
FIG. 7 is a schematic diagram of an example of an implementation of the implementation shown in FIG. 5.

In FIG. 7, a schematic diagram of an implementation example of the implementation of FIG. 5 is shown. This particular example is implemented with bipolar transistors.

First biasing circuit 700 provides a bias current on signal line 706. The current is provided, after passage through an inductor for RF isolation, to the base of a transistor in the driver stage 714 of power amplifier. It is appreciated by those skilled in the art that the first biasing circuit 700 is only one of many possible implementations and need not be explained further. The magnitude of the bias current provided on signal line 706 bears a high degree of correlation to the envelope of the RF signal input to the driver stage 714.

Similarly, first biasing circuit 708 provides a bias current on signal line 718. The current is provided, after passage through an inductor for RF isolation, to the base of a transistor in the power stage 716 of a power amplifier. Again, it is appreciated that the first biasing circuit 708 is only one of many possible implementations, and need not be explained further.

Resistor 730 in combination with either of transistors 728 and 734 form comparators. Assume that the bias current on signal line 706 is sufficiently small such that the current through resistor 730 (which is essentially the same as the current on signal line 706) does not give rise to a voltage drop across resistor 730 that would be sufficient to turn off transistor 728 or transistor 734 in second biasing circuit 702 and second biasing circuit 710, respectively.

Because transistor 728 is turned on, current flows through resistor 740, and resistor 740 is configured such that the current through it generates a voltage drop that is sufficient to turn off transistor 743. Because transistor 743 is turned off, no boost current is provided on signal line 724. Accordingly, within summer 704, the current on signal line 706 is provided directly to signal line 720 and then to the driver stage 714.

Because transistor 734 is turned on, current flows through resistor 738, and resistor 738 is configured such that the current through it generates a voltage drop, which is sufficient to turn off transistor 736. Because transistor 736 is turned off, no boost current is provided on signal line 726. Accordingly, within summer 712, the current on signal line 718 is provided directly to signal line 722 and then to the power stage 716.

As the envelope of the RF signal increases, eventually the bias current on signal line 706 will be such that the voltage drop across resistor 730 will be sufficient to turn off transistors 728 and 734 independently, as a function of the biasing conditions initially set for transistors 728 and 734. When transistor 728 turns off, only the very small base current of transistor 743 flows through resistor 740. Similarly, when transistor 734 turns off, only the very small base current of transistor 736 flows through resistor 738. Consequently, when transistors 728 and 734 are turned off, the voltages at the base of transistors 743 and 736 will approach $V_{CC}$. Transistor 743 will turn on, and a boost current will be provided on signal line 724. The boost current will be added to the bias current on signal line 706 by summer 704. The result is a current on signal line 720 which is the sum of the current on signal line 706 and the boost current on signal line 724. Similarly, transistor 736 will turn on, and a boost current will be provided on signal line 726. The boost current will be added to the bias current on signal line 718 by summer 712. The result is a current on signal line 722 that is the sum of the current on signal line 718 and the boost current on signal line 726.

Figure 8:
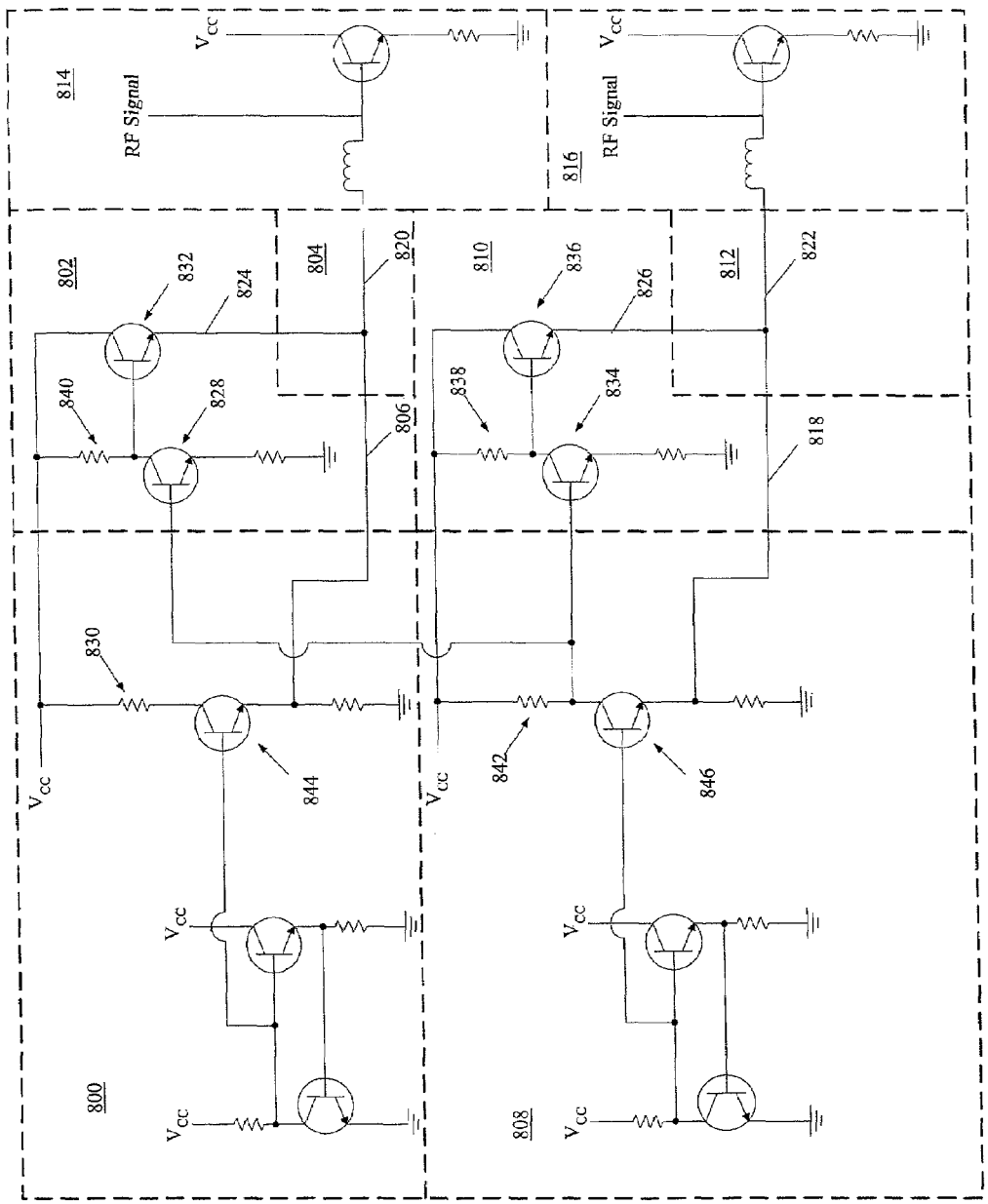
FIG. 8 is a schematic diagram of an example of an implementation of the implementation shown in FIG. 6.

In FIG. 8, a schematic diagram of an implementation example of the implementation of FIG. 6 is shown. This particular example may be implemented with bipolar transistors. In FIG. 8, first biasing circuit 808 provides a bias current on signal line 818. The current is provided, a passage through an inductor for RF isolation, to the base of a transistor in the power stage 816 of a power amplifier. It is appreciated that the first biasing circuit 808 is only one of many possible implementations and need not be explained further. The magnitude of the bias current provided on signal line 818 bears a high degree of correlation to the envelope of the RF signal input to the driver stage 814.

Similarly, first biasing circuit 800 provides a bias current on signal line 806. The current is provided, after passage through an inductor for RF isolation, to the base of a transistor in the driver stage 814 of a power amplifier. Again, it is appreciated that the first biasing circuit 800 is only one of many possible implementations, and need not be explained further.

Resistor 842 in combination with either of transistors 834 and 828 form comparators. Assume that the bias current on signal line 818 is sufficiently small such that the current through resistor 842 (which is essentially the same as the current on signal lime 818) does not give rise to a voltage drop across resistor 842 that would be sufficient to turn off transistor 834 or transistor 828 in second biasing circuit 810 and second biasing circuit 802, respectively.

Because transistor 834 is turned on, current flows through resistor 838, and resistor 838 is configured such that the current through it generates a voltage drop that is sufficient to turn off transistor 836. Because transistor 836 is turned off, no boost current is provided on signal line 826. Accordingly, within summer 812, the current on signal line 818 is provided directly to signal line 822 and then to the power stage 816.

Because transistor 828 is turned on, current flows through resistor 840, and resistor 840 is configured such that the current through it generates a voltage drop that is sufficient to turn off transistor 832. Because transistor 832 is turned off, no boost current is provided on signal line 824. Accordingly, within summer 804, the current on signal line 806 is provided directly to signal line 820 and then to the driver stage 814.

As the envelope of the RF signal increases, eventually the bias current on signal line 818 will be such that the voltage drop across resistor 842 will be sufficient to turn off transistors 828 and 834 independently, as a function of the biasing conditions initially set for transistors 828 and 834. When transistor 834 turns off, only the very small base current of transistor 836 flows through resistor 838. Similarly, when transistor 828 turns off, only the very small base current of transistor 832 flows through resistor 840. Consequently, when transistors 828 and 834 are turned off, the voltages at the bases of transistors 832 and 836 will approach $V_{CC}$. Transistor 836 will turn on, and a boost current will be provided on signal line 826. The boost current will be added to the bias current on signal line 818 by summer 812. The result is a current on signal line 822 which is the sum of the current on signal line 818 and the boost current on signal line 826. Similarly, transistor 832 will turn on, and a boost current will be provided on signal line 824. The boost current will be added to the bias current on signal line 806 by summer 804. The result is a current on signal line 820 that is the sum of the current on signal line 806 and the boost current on signal line 824.

The examples of the circuit implementations of FIG. 7 and FIG. 8 have an inherent negative feedback mechanism that enhances the functionality of the systems described by FIGS. 5 and 6. This circuit topology has the advantage of automatically preventing the boost currents on signal lines 824 and 826 from increasing indefinitely when transistors 832 and 836, respectively, are allowed to turn ON. Hence this topology enhances the reliability of the biasing circuitry with an inherent safety mechanism that prevents the destructive effects of current overloading that could happen in an uncontrolled situation such as positive feedback.

In the case of the circuit implementation of FIG. 7, as the current through resistor 730 exceeds a predetermined threshold and continues to increase proportionally with the amplitude of the envelope of the RF signal, transistor 728 is turned OFF and allows transistor 743 to be turned ON, thus providing the boost current on signal line 724. This has also the consequence of increasing the voltage on signal line 706. The negative feedback mechanism can be explained by considering that the increase of this voltage on signal line 706 tends to reduce the biasing of the buffer transistor 744 that delivers the current on signal line 706, as a result of raising its emitter voltage with respect to the ground potential. Consequently, a reduction in the current through resistor 730 tends to increase the biasing of transistor 728, which has the effect of limiting the biasing of transistor 743, thus limiting the maximum value of the boost current on signal line 724. This negative feedback mechanism ensures a state of equilibrium between the biasing of the buffer transistor 744 and transistor 743, so that the maximum available current on signal line 720 is equal to the sum of the current on signal line 706 and the amplitude limited boost current on signal line 724.

Similarly, in the case of the circuit implementation of FIG. 8, as the current through resistor 842 exceeds a predetermined threshold and continues to increase proportionally with the amplitude of the envelope of the RF signal, transistor 834 is turned OFF and allows transistor 836 to be turned ON, thus providing the boost current on signal line 826. This has also the consequence of increasing the voltage on signal line 818. The negative feedback mechanism can be explained by considering that the increase of this voltage on signal line 818 tends to reduce the biasing of the buffer transistor 846 that delivers the current on signal line 818, as a result of raising its emitter voltage with respect to the ground potential. Consequently, a reduction in the current through resistor 842 tends to increase the biasing of transistor 834, which has the effect of limiting the biasing of transistor 836, thus limiting the maximum value of the boost current on signal line 826. This negative feedback mechanism ensures a state of equilibrium between the biasing of the buffer transistor 846 and transistor 836, so that the maximum available current on signal line 822 is equal to the sum of the current on signal line 818 and the amplitude limited boost current on signal line 826.

While the supply voltage shown in FIGS. 7 and 8 is shown always equal to the constant $V_{CC}$, it should be appreciated that implementations are possible where the supply voltage differs as applied to different parts of the circuits of FIGS. 7 and 8.

Figure 9:
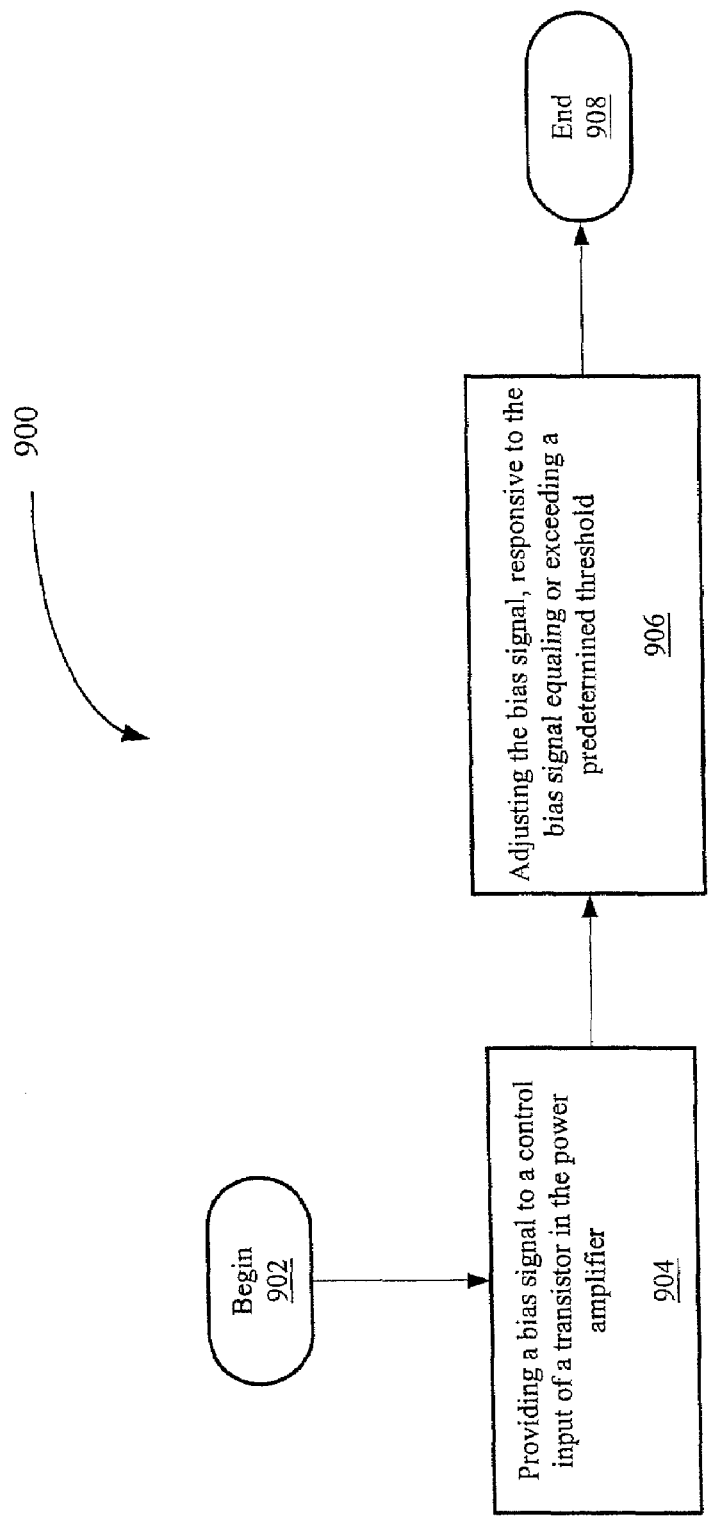
FIG. 9 is a flowchart illustrating an example method for dynamically biasing a power amplifier utilizing the DBS.

A flowchart 900 of an example method of dynamically biasing a power amplifier is illustrated in FIG. 9. The process begins in step 902 and in step 904, a bias signal provides a control input signal to a transistor in the power amplifier. In one implementation, the control input signal is the base current of a bipolar transistor. In step 906, the bias signal is adjusted responsive to the bias signal equaling or exceeding a predetermined threshold. The adjusted bias signal is a boosted form of the bias signal and the bias signal may exhibit a high degree of correlation with the envelope of the RF input to the power amplifier. The process then ends at step 908.

Figure 10:
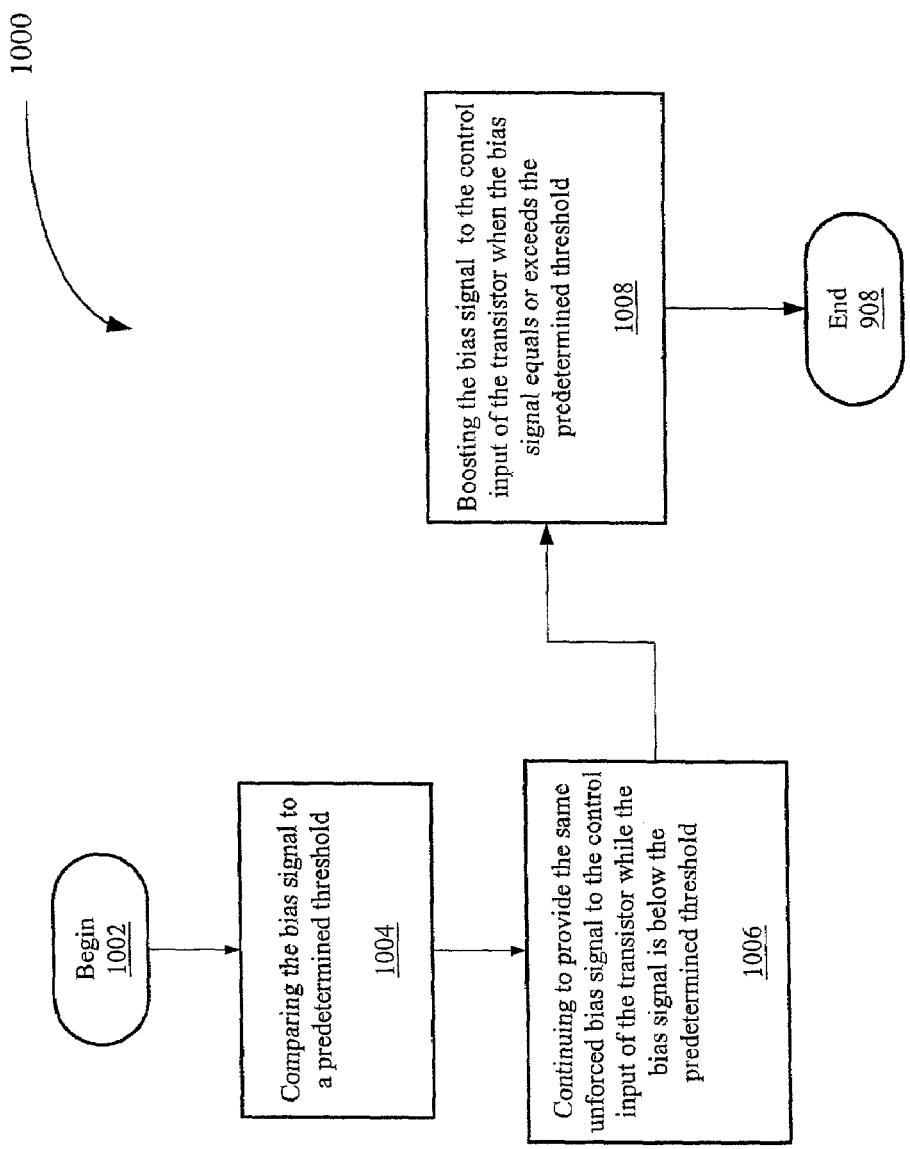
FIG. 10 is a flowchart illustrating an example of an implementation of the adjusting step of FIG. 9.

A flowchart 1000 of an example method of sub-steps for the adjusting step 902 in FIG. 9 is illustrated in FIG. 10. The example process begins in step 1002 and in sub-step 1004, the bias signal is compared to a predetermined threshold. In sub-step 1006, the method continues to provide the same unforced bias signal to the control input of the transistor in the power amplifier while the bias signal is below the predetermined threshold. In sub-step 1008, the method boosts the bias signal to the control input of the transistor in the power amplifier when the bias signal equals or exceeds the predetermined threshold. The process then ends in step 908.

Figure 11:
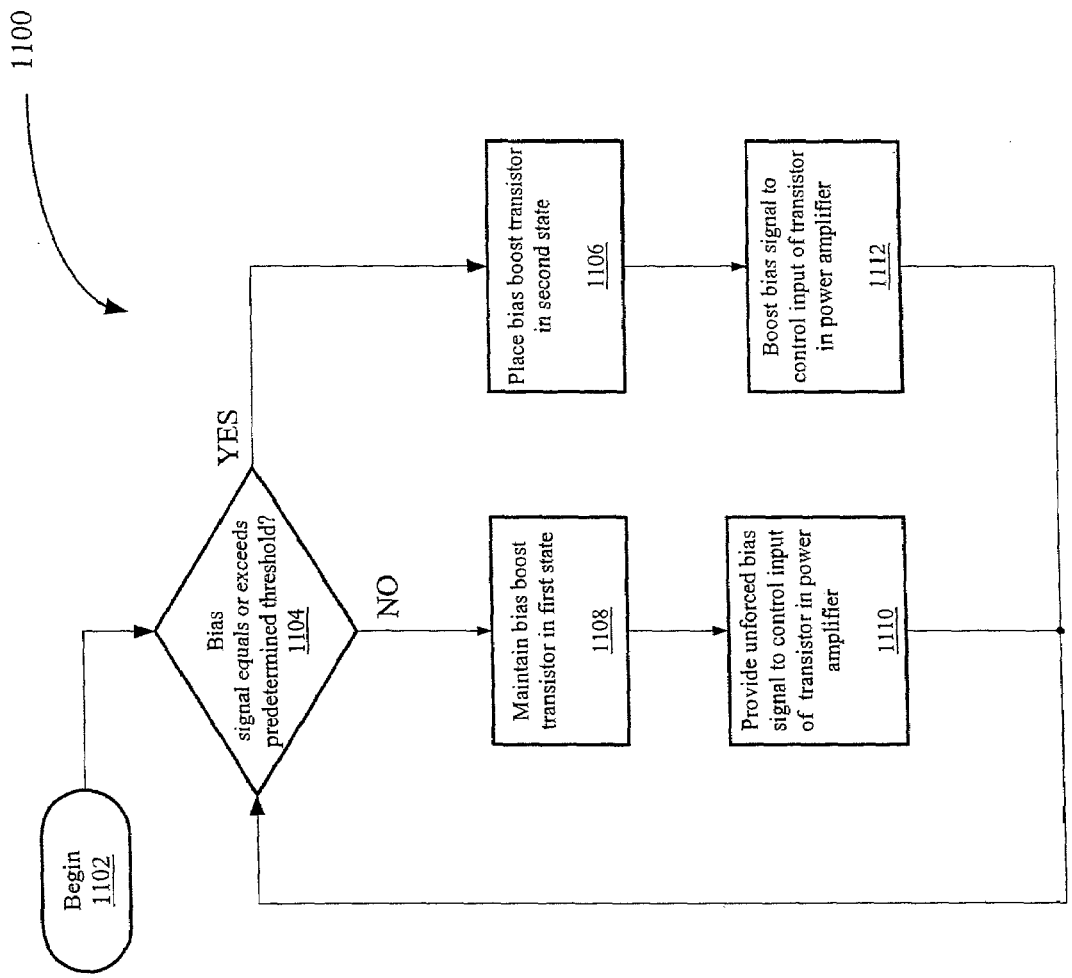
FIG. 11 is a flowchart illustrating another example of an implementation of the method of FIG. 10.

A flowchart 1100 of an example method of operation of a DBS is illustrated in FIG. 11. The process begins in step 1102 and in decision step 1104, a bias signal to a control input of a transistor in a power amplifier is compared to a predetermined threshold. If the bias signal equals or exceeds the predetermined threshold, step 1106 is performed. Otherwise, step 1108 is performed.

In step 1108, a bias boost transistor is maintained in a first state, which in one implementation is the OFF state. Step 1108 is followed by step 1110, where the unforced bias signal is provided to the control input of the transistor in the power amplifier. The process then returns to step 1104 and the process repeats itself.

In step 1106, the bias boost transistor is placed in a second state, which in one implementation is the ON state. Step 1106 is followed by step 1112, where the bias signal to the control input of the transistor in the power amplifier is boosted. The process then returns to step 1104, where the process repeats itself.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for dynamically biasing a power amplifier, comprising:
   providing a bias signal to a control input of a transistor in the power amplifier;
   comparing the bias signal to a predetermined threshold; and
   adjusting the bias signal responsive to the bias signal being below, equal, or above the predetermined threshold, wherein adjusting the bias signal includes increasing the bias signal when it equals or exceeds the predetermined threshold.

2. The method of claim 1, wherein adjusting the bias signal includes continuing to provide the unadjusted bias signal to the control input so long as the bias signal remains below the predetermined threshold.

3. The method of claim 1, further comprising: detecting an envelope of an incoming RF signal to the power amplifier; and correlating the bias signal with the envelope.

4. The method of claim 2, further comprising:
   detecting an envelope of an output RF signal from the power amplifier; and
   correlating the bias signal with the envelope.

5. The method of claim 1, further comprising:
   detecting an envelope of an incoming RF signal to the power amplifier; and
   correlating the bias signal with the envelope.

6. The method of claim 1, further comprising:
   detecting an envelope of an output RF signal from the power amplifier; and
   correlating the bias signal with the envelope.

7. A dynamic biasing system ("DBS") for dynamically biasing an amplifier with an adjusted bias signal, the DBS comprising:
   a first biasing circuit that produces a bias signal independently of an external detection circuit, wherein the bias signal is indicative of an envelope of a radio frequency (RF) signal; and
   a second biasing circuit in signal communication with both the first biasing circuit and the amplifier, wherein the second biasing circuit compares the bias signal to a predetermined threshold and in response produces the adjusted bias signal, wherein the second biasing circuit produces a boosting signal in response to comparing the bias signal to the predetermined threshold.

8. The DBS of claim 7, wherein the first biasing circuit correlates the bias signal with an envelope of a radio frequency ("RF") input signal to the amplifier.

9. The DBS of claim 7, wherein the first biasing circuit correlates the bias signal with an envelope of a RF output signal to the amplifier.

10. The DBS of claim 8, further including a combiner in signal communication with the first biasing circuit, second biasing circuit and the amplifier, wherein the combiner produces the adjusted bias signal by combining the bias signal with the boosting signal.

11. A method for dynamically biasing a power amplifier, comprising:

providing a bias signal to a control input of a transistor in the power amplifier, the bias signal provided independently of an external detection circuit, wherein the bias signal is indicative of an envelope of a radio frequency (RF) signal;

comparing the bias signal to a predetermined threshold; and adjusting the bias signal responsive to the bias signal being below, equal, or above the predetermined threshold, wherein adjusting the bias signal includes continuing to provide the unadjusted bias signal to the control input so long as the bias signal remains below the predetermined threshold.

12. The method of claim 11, further comprising: detecting an envelope of an incoming RF signal to the power amplifier; and correlating the bias signal with the envelope.

13. The method of claim 12, further comprising:

detecting an envelope of an output RF signal from the power amplifier; and correlating the bias signal with the envelope.

14. The method of claim 11, wherein adjusting the bias signal includes increasing the bias signal when it equals or exceeds the predetermined threshold.

\* \* \* \* \*